US012744543B2

(12) United States Patent
Ivanisevic et al.

(10) Patent No.: US 12,744,543 B2
(45) Date of Patent: Sep. 22, 2026

(54) THREE-STATE BUFFER CIRCUIT

(71) Applicant: Telefonaktiebolaget LM Ericsson (publ), Stockholm (SE)

(72) Inventors: Nikola Ivanisevic, Älvsjö (SE); Daniele Mastantuono, Lund (SE); Mattias Palm, Bara (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 39 days.

(21) Appl. No.: 18/871,722

(22) PCT Filed: May 16, 2022

(86) PCT No.: PCT/EP2022/063120
§ 371 (c)(1),
(2) Date: Dec. 4, 2024

(87) PCT Pub. No.: WO2023/222179
PCT Pub. Date: Nov. 23, 2023

(65) Prior Publication Data
US 2025/0233599 A1 Jul. 17, 2025

(51) Int. Cl.
*H03M 1/12* (2006.01)
*H03K 3/356* (2006.01)
*H03M 3/00* (2006.01)

(52) U.S. Cl.
CPC ...... *H03M 1/124* (2013.01); *H03K 3/356104* (2013.01); *H03M 1/1245* (2013.01);
(Continued)

(58) Field of Classification Search
CPC ...... H03M 1/124; H03M 3/496; H03M 3/342; H03M 1/1295; H03M 1/1245; H03M 1/1215; H03K 3/356104
See application file for complete search history.

(56) References Cited

U.S. PATENT DOCUMENTS 5,153,464 A * 10/1992 Joly ................. H03K 19/00307 326/85
7,248,076 B2 * 7/2007 Chen ................ H03K 19/09429 326/83

(Continued)

OTHER PUBLICATIONS

International Search Report and Written Opinion dated Feb. 13, 2023 for International Application No. PCT/EP2022/063120 filed on May 16, 2022, consisting of 12 pages.

(Continued)

*Primary Examiner* — Khai M Nguyen
(74) *Attorney, Agent, or Firm* — Weisberg I.P. Law, P.A.

(57) ABSTRACT

Presented herein is a three-state buffer circuit having a voltage follower for directly driving a sampling capacitor at an output terminal of the three-state buffer circuit. The three-state buffer circuit further includes a switched capacitor circuit connected at an input of the voltage follower and configured to control the voltage follower to operate in one of a plurality of states. The states are: a tracking state, at which the voltage follower is configured to provide an output voltage at the output terminal at a level corresponding to an input voltage at an input terminal of the three-state buffer circuit; a hold state, at which the voltage follower is configured not to provide any output voltage at the output terminal; and a reset state at which the voltage follower is configured to provide an output voltage at the output terminal at a reset voltage.

20 Claims, 8 Drawing Sheets

(52) U.S. Cl.
CPC ......... *H03M 1/1295* (2013.01); *H03M 3/496* (2013.01); *H03M 1/1215* (2013.01); *H03M 3/342* (2013.01)

(56) References Cited

U.S. PATENT DOCUMENTS

| | | | |
|---|---|---|---|
| 9,692,364 | B2 | 6/2017 | D'Souza et al. |
| 10,333,394 | B2 | 6/2019 | Awad |

OTHER PUBLICATIONS

I. Akita, et al.; A 7-Bit 1.5-GS/s Time-Interleaved SAR ADC with Dynamic Track-and-Hold Amplifier; IEEE Asian Solid-State Circuits Conference; IEEE; Date and Location: Jeju, Korea, Nov. 14-16, 2011; consisting of 4 pages.

J. K.R. Kim, et al.; A 12-b, 30-MS/s, 2.95-mW Pipelined ADC Using Single-Stage Class-AB Amplipers and Deterministic Background Calibration; IEEE Journal of Solid-State Circuits, vol. 47, No. 9; IEEE; Sep. 2012; consisting of 11 pages.

F. Michel, et al.; A 250 mV 7.5 μW 61 dB SNDR SC ΔΣ Modulator Using Near-Threshold-Voltage-Biased Inverter Amplifiers in 130 nm CMOS; IEEE Journal of Solid-State Circuits, vol. 47, No. 3; IEEE Xplore; Mar. 2012; consisting of 13 pages.

A. Moriyama, et al.; A Low-Distortion Switched-Source-Follower Track-and-Hold Circuit; IEEE Xplore; IEEE; 2012; consisting of 4 pages.

B. Hershberg, et al.; Ring Amplifiers for Switched Capacitor Circuits; IEEE Journal of Solid-State Circuits, vol. 47, No. 12; IEEE; Dec. 2012; consisting of 15 pages.

J. Conrad, et al.; Design Approach for Ring Amplifiers; IEEE Transactions on Circuits and Systems—I: Regular papers, vol. 67, No. 10, Oct. 2020; consisting of 14 pages.

* cited by examiner

THREE-STATE BUFFER CIRCUIT

CROSS-REFERENCE TO RELATED APPLICATION

This application is a Submission Under 35 U.S.C. § 371 for U.S. National Stage Patent Application of International Application Number: PCT/EP2022/063120, filed May 16, 2022 entitled "THREE-STATE BUFFER CIRCUIT," the entirety of which is incorporated herein by reference.

TECHNICAL FIELD

The present disclosure relates to buffer circuits and more precisely to a three-state buffer circuit having a reset, a track, and a hold state.

BACKGROUND

People and devices around the globe are becoming more and more connected. These connections are based on certain communication protocols and are nowadays generally digital. As the need for communication increases, the bitrate of the digital communication increases. Many communication paths comprise one or more analog portions, generally in the form of a wireless interface. Wireless interfaces are available in substantially any frequency band from a few kHz (the Grimeton radio station) to several THz (Beyond 5G telecommunication).

Analog interfaces require the transformation of a digital signal into a corresponding analog signal upon transmission across the analog interface. At the receiving end, the reception of the analog signal generally requires transformation back to a digital representation for further processing or transmission. As the bitrate increase, the devices communicating across the analog interface are posed with stringent requirements. Devices configured to directly convert the analog signal directly to a digital representation without introducing any down-conversion mixer are researched also for the higher frequency bands. Such devices are required to provide a certain instantaneous bandwidth (IBW), or real-time bandwidth, increasing the required sampling rate of analog to digital converters (ADCs) of the devices. The required sampling rate has to be provided with high accuracy and the linearity of the ADC is preferably not compromised with the increased sampling rate.

One component affecting the linearity of ADCs is the track-and-hold (T/H) circuit. An ADC may comprise a plurality of T/H circuits triggered at different clock phases in a time-interleaving manner. Generally, a T/H is designed to be power efficient, small, linear and have limited memory effects (residual charge on parasitic or intentional capacitors) between two consecutive samples. These requirements are generally contradicting and conventional bootstrap switches at the input may be introduced to increase linearity, however bootstrap switches require significant area and consumes considerable amounts of power.

From the above it is understood that there is room for improvements.

SUMMARY

It is in view of the above considerations and others that the various embodiments of this disclosure have been made. The present disclosure therefor recognizes the fact that there is a need for alternatives to (e.g. improvement of) the existing art described above.

It is an object of some embodiments to solve, mitigate, alleviate, or eliminate at least some of the above or other disadvantages.

An object of the present disclosure is to provide a new type of buffer circuit which is improved over prior art and which eliminates or at least mitigates the drawbacks discussed above. More specifically, an object of the invention is to provide a three-state buffer circuit that is usable in a track-and-hold circuit. These objects are achieved by the technique set forth in the appended independent claims with preferred embodiments defined in the dependent claims related thereto.

In a first aspect, a three-state buffer circuit comprising a voltage follower for directly driving a sampling capacitor at an output terminal of the three-state buffer circuit is presented. The three-state buffer circuit further comprises a switched capacitor circuit connected at an input of the voltage follower and configured to control the voltage follower to operate in one of a tracking state, a hold state and a reset state. At the tracking state, the voltage follower is configured to provide an output voltage at the output terminal at a level corresponding to an input voltage at an input terminal of the three-state buffer circuit. At the hold state, the voltage follower is configured not to provide any output voltage at the output terminal. And at the reset state, the voltage follower is configured to provide an output voltage at the output terminal at a reset voltage.

In some variants, the voltage follower is a source follower arrangement comprising a first source follower and a second source follower operating as a complementary source follower. The switched capacitor circuit further comprises a first DC shift device arranged between the first source follower and the input terminal of the three-state buffer circuit, and a second DC shift device arranged between the second source follower and the input terminal of the three-state buffer circuit. The output terminal of the three-state buffer circuit is provided at the source terminals of the first source follower and the second source follower.

In some variants, the switched capacitor circuit comprises a first switch arrangement configured to be controlled by a reset control signal and thereby operable to bias the input of the voltage follower to an active state.

In some variants, the first switch arrangement comprises a first high side reset switch controlled by the reset control signal and thereby operable to connect a gate of the first source follower to a first voltage, and a first low side reset switch controlled by the reset control signal and thereby operable to connect a gate of the second source follower to a second voltage.

In some variants, the three-state buffer circuit further comprises a second switch arrangement configured to be controlled by the reset control signal. The second switch arrangement comprises a second high side reset switch operable to connect a first offset voltage between the first DC-shift device and the input terminal of the three-state buffer circuit and a second low side reset switch operable to connect a second offset voltage between the second DC-shift device and the input terminal of the three-state buffer circuit.

In some variants, the first offset voltage and the second offset voltage are equal.

In some variants, the three-state buffer circuit is configured to operate in the reset state responsive to a state of the reset control signal.

In some variants, wherein the switched capacitor circuit comprises a first switch arrangement configured to be controlled by a hold control signal and thereby operable to connect the input of the voltage follower to a hold voltage configured to disable the voltage follower.

In some variants, the first switch arrangement comprises a high side hold switch controlled by the hold control signal and thereby operable to connect the gate of the first source follower to the second voltage, and a low side hold switch controlled by the hold control signal and operable to connect the gate of the second source follower to the first voltage.

In some variants, the three-state buffer circuit is configured to operate in the hold state responsive to a state of the hold control signal.

In some variants, the switched capacitor circuit further comprises a tracking switch arrangement controlled by a tracking control signal and operable to control a connection between the input terminal of the three-state buffer circuit and the input of the voltage follower.

In some variants, the tracking switch arrangement comprises a high side tracking switch controlled by the tracking control signal and operable to connect the first DC shift device to the input terminal of the three-state buffer circuit, and a low side tracking switch controlled by the tracking control signal and operable to connect the second DC shift device to the input terminal of the three-state buffer circuit.

In some variants, the three-state buffer circuit is configured to operate in the tracking state responsive to a state of a tracking control signal.

In some variants, the first source follower is an NMOS source follower and the second source follower is a PMOS source follower.

In some variants, at least one of the first DC shift device and the second DC shift device is a capacitor.

In a second aspect, a controller operatively connected to the three-state buffer circuit of first aspect is presented. The controller is configured to control a reset control signal, a hold control signal and a tracking control signal between respective active and non-active states for predefined or configurable periods of time. The controller is configured to only control one of the control signals into an active state at a time.

In some variants, the controller is further configured to control each of the control signals into an active state with a duty cycle of ⅓.

In a third aspect, a resettable track and hold circuit is presented. The resettable track and hold circuit comprises the three-state buffer circuit of the first aspect and a sampling capacitor connected in parallel between the output terminal of the three-state buffer circuit and an output terminal of the resettable track and hold circuit. This provides the output voltage of the three-state buffer circuit across the sampling capacitor.

In some variants, the resettable track and hold circuit further comprises the controller the second aspect.

In a fourth aspect, an analog to digital converter (ADC) comprising the resettable track and hold circuit of the third aspect is presented.

In some variants, the analog to digital converter is a successive-approximation ADC, (SAR ADC).

In some variants, the sampling capacitors of the resettable track and hold circuits are binary-weighted capacitors.

In some variants, the sampling capacitors of the resettable track and hold circuits are unary-weighted capacitors.

In a fifth aspect, an integrated circuit comprising the ADC of the fourth aspect is presented.

In a sixth aspect, an apparatus comprising the ADC of the fourth aspect is presented.

In some variants, the apparatus is a network node.

In some variants, the apparatus is a wireless device.

An advantage of some variants is that a settling and charging time of a load, e.g. the sampling capacitor is reduced. This is an effect of series resistance present in e.g. prior art sampling switches.

An advantage of some variants is that they are compatible solution with complementary source-followers, i.e. an NMOS and PMOS source follower working in parallel.

An advantage of some variants is that the biasing of a complementary source follower is simplified. Only a pair of switches connected to the supply rails provide sufficient biasing.

An advantage of some variants is that all states, also the reset functionality, are provided with corresponding settling times of the voltage follower without introducing extra parasitic capacitance in the charging path of sampling capacitor.

An advantage of some variants is that control logic allows for customization of the duration of each state. This enables matching of transfer functions between several three-state buffer circuits.

An advantage of some variants is that they provide comparable or better linearity and noise compared to a prior art buffer utilizing a bootstrapped switch solution. This is provided with a simplified design and an area effective implementation.

An advantage of some variants is that a bias T network is implemented without large resistors or capacitors thereby significantly reducing memory effects of the circuit.

BRIEF DESCRIPTION OF THE DRAWINGS

These and other aspects, features and advantages will be apparent and elucidated from the following description of various embodiments; references being made to the appended diagrammatical drawings which illustrate non-limiting examples of how the concept can be reduced into practice.

DETAILED DESCRIPTION

Hereinafter, certain embodiments will be described more fully with reference to the accompanying drawings. The invention described throughout this disclosure may, however, be embodied in many different forms and should not be construed as limited to the embodiments set forth herein; rather, these embodiments are provided by way of example so that this disclosure will be thorough and complete, and will fully convey the scope of the invention, such as it is defined in the appended claims, to those skilled in the art.

The term "coupled" is defined as connected, although not necessarily directly, and not necessarily mechanically. Two or more items that are "coupled" may be integral with each other. The terms "a" and "an" are defined as one or more unless this disclosure explicitly requires otherwise. The terms "substantially," "approximately," and "about" are defined as largely, but not necessarily wholly what is specified, as understood by a person of ordinary skill in the art. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method that "comprises," "has," "includes" or "contains" one or more steps possesses those one or more steps, but is not limited to possessing only those one or more steps.

Figure 1A:
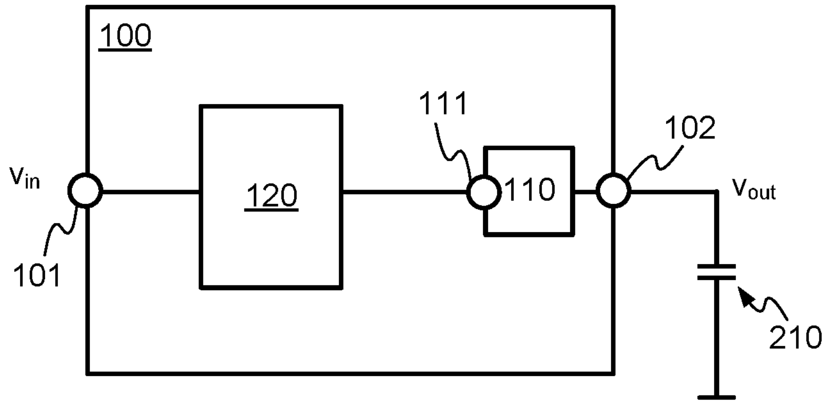
FIGS. 1*a-b* are schematic views of three-state buffer circuits according to some embodiments.

In FIG. 1*a*, a schematic view of a three-state buffer circuit 100 according to embodiments of the present disclosure is shown. The three-state buffer circuit 100 is provided with an input terminal 101 configured to receive an input voltage $v_{in}$ from sources external to the three-state buffer circuit 100. The input voltage $v_{in}$ will commonly be described as comprising an analogue radio frequency (RF) signal but may be any signal usable with the three-state buffer circuit 100. In some embodiments, the input voltage $v_{in}$ further comprises a DC component. The three-state buffer circuit 100 comprises at least one switched capacitor circuit 120 and at least one voltage follower 110. The switched capacitor circuit 120 is connected between the input terminal 101 of the three-state buffer circuit 100 and an input 111 of the voltage follower 110. The three-state buffer circuit 100 is further provided with an output terminal 102. The voltage follower 110 is configured to provide an output voltage $v_{out}$ at the output terminal. The output $v_{out}$ voltage is determined by the switched capacitor circuit 120. The switched capacitor circuit 120 is operable in at least three states T, H, R (see FIGS. 3*a*, 4*a* and 5*a*). The three-state buffer circuit 100 is configured for driving a sampling capacitor 210 when connected at the output terminal 102 of the three-state buffer circuit 100. In other words, the voltage follower 110 of the three-state buffer circuit 100 may be directly connected to the sampling capacitor 210. In the following, a brief introduction to the three states T, H, R will be given, but further details and embodiments will be presented in other parts of the disclosure.

At a first state, a tracking state T, the voltage follower 110 is preferably configured to provide an output voltage $v_{out}$ at the output terminal 102 at a level corresponding to an input voltage $v_{in}$ at the input terminal 101 of the three-state buffer circuit 100. As the naming implies, at the tracking state T, the output voltage $v_{out}$ of the three-state buffer circuit 100 will track the input voltage $v_{in}$ of the three-state buffer circuit 100.

At a second state, a hold state H, the voltage follower 110 is preferably configured not to provide any output voltage $v_{out}$ at the output terminal 102. If a sampling capacitor 210 is provided at the output terminal 102 of the three-state buffer circuit, the sampling capacitor 210 will maintain (hold) the latest output voltage $v_{out}$ provided at the output terminal 102. At the hold state H, the output terminal 102 of the three-state buffer is preferably at a high impedance state.

At a third state, a reset state R, the voltage follower 110 is preferably configured to provide an output voltage $v_{out}$ at the output terminal 102 at a reset voltage $V_{res}$.

Figure 1B:
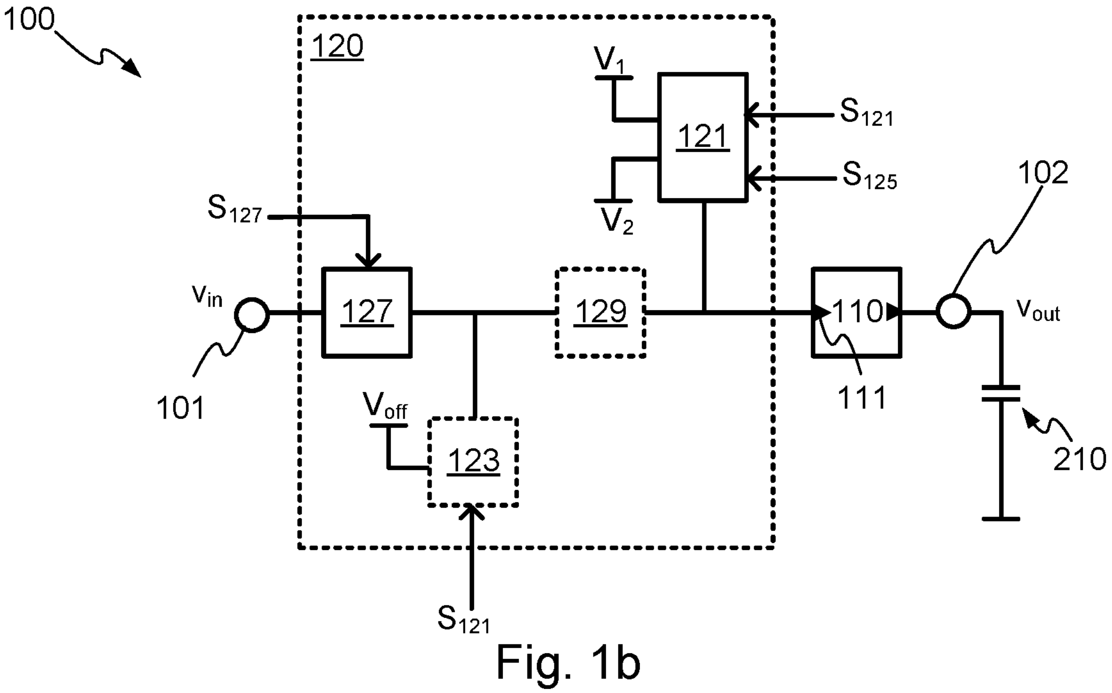

With reference to FIG. 1*b*, the conceptual workings of the three-state buffer circuit 100 according to embodiments of the present disclosure will be explained. In FIG. 1*b*, the voltage follower 110 may be configured as an operational amplifier (OP-amp) arranged as a buffer circuit. That is to say, the output of the OP-amp is fed back to a negative input and the input voltage $v_{in}$ is operatively connected to a positive input of the OP-amp. In the conceptual three-state buffer circuit 100 of FIG. 1*b*, the switched capacitor circuit 120 comprises two switch arrangements 121, 127.

A first switch arrangement 121 is arranged configured to be controlled by a reset control signal $S_{121}$ and/or a hold control signal $S_{125}$. The first switch arrangement 121 is operable to bias the input 111 of the voltage follower between a first voltage $V_1$ and a second voltage $V_2$ depending on the configuration of the reset control signal $S_{121}$ and the hold control signal $S_{125}$. A tracking switch arrangement 127 may be arranged between the input 111 of the voltage follower 110 and the input terminal 101 of the three-state buffer circuit 100 and controlled by a tracking control signal $S_{127}$. The tracking switch arrangement 127 is operable to control a connection between the input terminal 101 of the three-state buffer circuit 100 and the input 111 of the voltage follower 110.

In embodiments wherein the voltage follower 110 is configured as an OP-amp, the skilled person will appreciate that the first switch arrangement 127 will be arranged to control a bias voltage of the OP-amp rather than the input port. Based on the full disclosure herein, the skilled person will understand how to arrange the first switch arrangement 127 to arrive at the technical effects and benefits presented herein.

In some embodiments, as will be explained in other parts of the disclosure, it may be beneficial to arrange a DC shift arrangement 129 between the input 111 of the voltage follower 110 and the input terminal 101 of the three-state buffer circuit 100. The first switch arrangement 121 is preferably arranged to control a voltage between the DC shift arrangement 129 and the input 111 of the voltage follower 110. A second switch arrangement 123 may be arranged to control a voltage between the DC shift arrangement 129 and the tracking switch arrangement 127. The second switch arrangement 123 may be configured to be controlled by the reset control signal $S_{121}$.

Note that all switch arrangements are provided between the voltage follower 110 and the input terminal 101, i.e. no switch arrangements are needed between the voltage follower 110 and the output terminal 102. This allows the three-state buffer circuit 100 to operate in all three states without any bootstrap switches feeding the output terminal 102 of the three-state buffer circuit 100. The three-state buffer circuit 100 may directly drive a load such as the sampling capacitor, thereby greatly reducing the complexity, power and area of a track and hold circuit 200 (see FIG. 7*a*).

Figure 2:
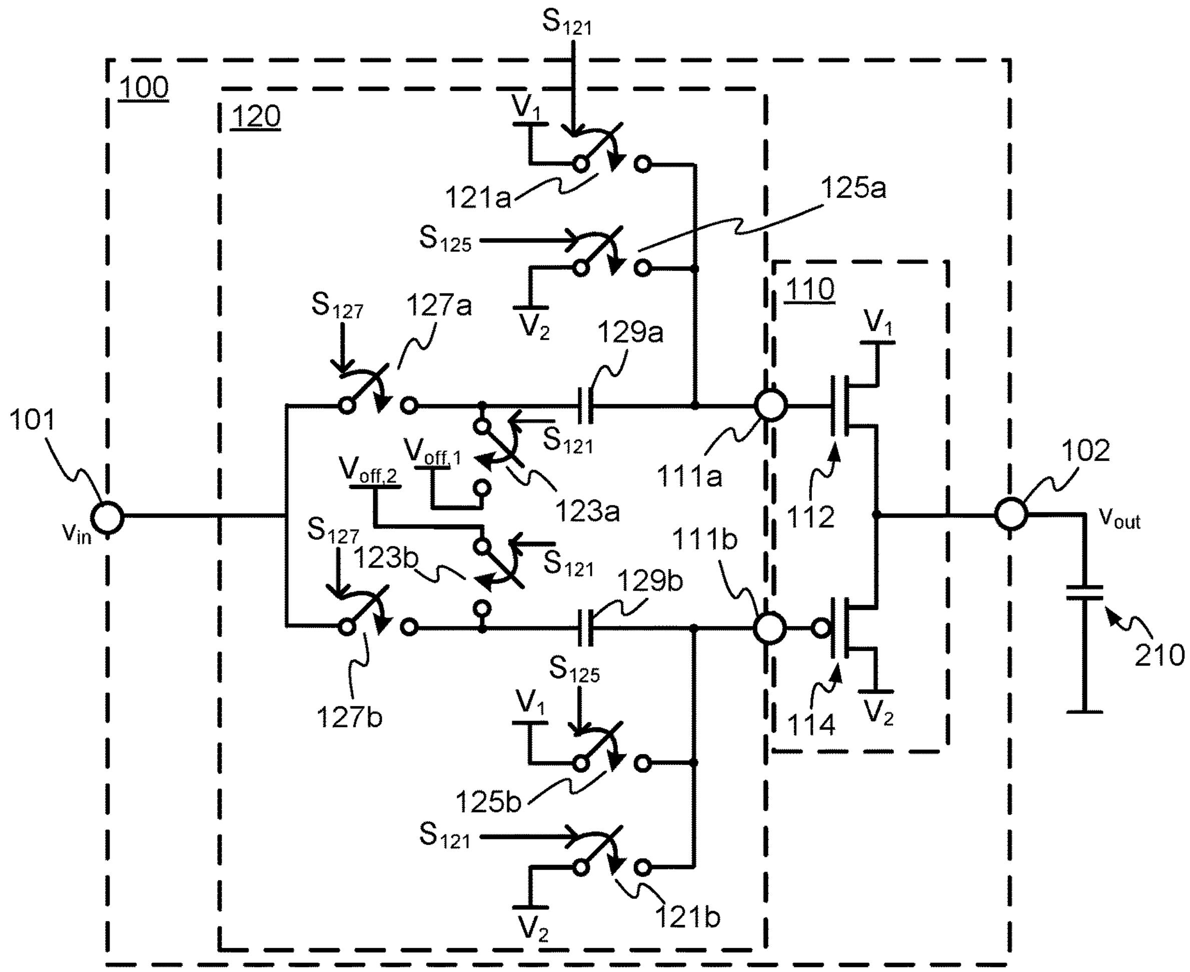
FIG. 2 is a schematic view of a three-state buffer circuit according to some embodiments.

In FIG. 2, a three-state buffer circuit 100 according to some embodiments of the present disclosure is shown. In this embodiment, the voltage follower 110 is configured as a source follower arrangement 110. The source follower arrangement 110 may comprise a first source follower 112 and a second source follower 114 arranged to operate as a complementary source follower. In FIG. 2, the first source follower 112 is exemplified as an NMOS device and the second source follower 114 is exemplified as a PMOS device. However, other topologies and architectures may very well be utilized and the voltage follower 110 is not limited to this particular configuration. The input 111 of the source follower 110 is provided at the gate 111*a* of the first source follower 112 and at the gate 111*b* of the second source follower 114. In other words, the input 111 of the source follower 110 may be described as provided with a high side input 111*a* at the gate of the first source follower 112 and a low side input 111*b* at the gate of the second source follower 114. The output terminal 102 of the three-state buffer circuit 100 is provided at the source terminals of the first source follower 112 and the second source follower 114. This arrangement of the source follower 110 allows the source follower 110 to directly provide high currents (compared to bootstrap configurations) in either direction to a load, the sampling capacitor 210, connected at the output terminal 102 of the three-state buffer circuit 100, i.e. at the source terminals of the first source follower 112 and the second source follower 114.

In order to explain the switched capacitor circuit 120, a brief functional introduction of the operations of the voltage follower 110 in FIG. 2 will be offered.

As previously mentioned, at the tracking state T, the voltage follower 110 is configured to provide an output voltage $v_{out}$ at the output terminal 102 at a level corresponding to the input voltage $v_{in}$. This may be accomplished by simply connecting the input voltage $v_{in}$ to the gates 111*a*, 111*b* of the source followers 112, 114.

When switching to the hold state H, the output voltage $v_{out}$ should preferably freeze (hold, maintain) the output voltage $v_{out}$ at a level corresponding to the input voltage $v_{in}$ that was provided when the three-state buffer circuit was switched to the hold state H. This may be provided by turning off the voltage follower 110. In some embodiments, thus may be accomplished by disconnecting (turning off, placing in high impedance) the input voltage $v_{in}$ from the gates 111*a*, 111*b* of the source followers 112, 114 and proving a deactivating voltage at the gates 111*a*, 111*b* of the source followers 112, 114. This implies connecting a positive supply rail $V_1$ to the gate 111*b* of the second source follower 114 and a negative supply rail $V_2$ to the gate 111*a* of the first source follower 112. Throughout the present disclosure, the positive supply rail $V_1$ may be referred to as a first voltage $V_1$. Correspondingly, the negative supply rail $V_2$ may be referred to as a second voltage $V_2$.

The reset state R is intended to control a voltage at the output terminal 102 of the three-state buffer circuit 100 to the reset voltage $V_{res}$. The reset voltage $V_{res}$ may be provided by disconnecting (turning off, placing in high impedance) the input voltage $v_{in}$ from the gates 111*a*, 111*b* of the source followers 112, 114 and providing an activating voltage at the gates 111*a*, 111*b* of the source followers 112, 114. This implies connecting a positive supply rail $V_1$ to the gate 111*a* of the first source follower 112 and a negative supply rail $V_2$ to the gate 111*b* of the second source follower 114.

The switched capacitor circuit 120 shown in FIG. 2 comprises a first high side reset switch 121*a* and a first low side reset switch 121*b*. The first high side reset switch 121*a* is connected between the gate 111*a* of the first source follower 112 and the positive supply rail $V_1$. The first low side reset switch 121*b* is connected between the gate 111*b* of the second source follower 114 and the negative supply rail $V_2$. The first high side reset switch 121*a* and the first low side reset switch 121*b* are both controlled by the reset control signal $S_{121}$. In other words, when the reset control signal $S_{121}$ is set (active), the gate 111*a* of the first source follower 112 is connected to the positive supply rail $V_1$ and the gate 111*b* of the second source follower 114 is connected to the negative supply rail $V_2$. The first high side reset switch 121*a* and the first low side reset switch 121*b* may be described as comprised in the first switch arrangement 121 presented with reference to FIG. 1*b*.

As shown in FIG. 1*b*, the switched capacitor circuit 120 may comprise the tracking switch arrangement 127. The tracking switch arrangement 127 may comprise a high side tracking switch 127*a* and a low side tracking switch 127*b*. The high side tracking switch 127*a* is arranged between the input terminal 101 of the three-state buffer circuit 100 and the gate 111*a* of the first source follower 112. The low side tracking switch 127*b* is arranged between the input terminal 101 of the three-state buffer circuit 100 and the gate 111*b* of the second source follower 114. The high side tracking switch 127*a* and the low side tracking switch 127*b* are both controlled by the tracking control signal $S_{127}$. In other words, when the tracking control signal $S_{127}$ is set (active), the gate 111*a* of the first source follower 112 is (operatively) connected to the input terminal 101 of the three-state buffer circuit 100 and the gate 111*b* of the second source follower 114 is also (operatively) connected to the input terminal 101 of the three-state buffer circuit 100.

In order to isolate the gates 111*a*, 111*b* of the source followers 112, 114, a first DC-shift device 129*a* (high side DC-shift device) may be arranged between the gate 111*a* of the first source follower 112 and the high side tracking switch 127*a*. Correspondingly, a second DC-shift device 129*b* (low side DC-shift device) may be arranged between the gate 111*b* of the second source follower 114 and the low side tracking switch 127*b*. The first DC-shift device 129*a* and the second DC-shift device 129*b* may be comprised in the DC shift arrangement 129 introduced in reference to FIG. 1*b*. The DC-shift devices 129*a*, 129*b* enable a DC level of each of the gates 111*a*, 111*b* of the source followers 112, 114 to be controlled independently. In some embodiments, the first DC-shift device 129*a* and/or the second DC-shift device 129*b* are provided as capacitors.

The second switch arrangement 123 (not shown in FIG. 2) may, in some embodiments, comprise a second high side reset switch 123*a* and a second low side reset switch 123*b*. The second high side reset switch 123*a* is connected, at one end, between the first DC-shift device 129*a* and the high side tracking switch 127*a*, and, at the other end, to a first offset voltage $V_{os,1}$. The second low side reset switch 123*b* is connected, at one end, between the second DC-shift device 129*b* and the low side tracking switch 127*b*, and, at the other end, to a second offset voltage $V_{os,2}$. The second switch arrangement 123, as will be explained elsewhere in the present disclosure, allows for control of an offset voltage provided across each of the first DC-shift device 129*a* and the second DC-shift device 129*b*.

The switched capacitor circuit 120 may further comprise a high side hold switch 125*a* and low side hold switch 125*b*. The high side hold switch 125*a* is connected between the gate 111*a* of the first source follower 112 and the negative supply rail $V_2$. The low side hold switch 125*b* is connected between the gate 111*b* of the second source follower 114 and the positive supply rail $V_2$. The high side hold switch 125*a* and the low side hold switch 125*b* are both controlled by the hold control signal $S_{125}$. In other words, when the hold control signal $S_{125}$ is set (active), the gate 111*a* of the first source follower 112 is connected to the negative supply rail $V_2$ and the gate 111*b* of the second source follower 114 is connected to the positive supply rail $V_1$. The high side hold switch 125*a* and the low side hold switch 125*b* may be described as comprised in the first switch arrangement 121 presented with reference to FIG. 1*b*.

The switches mentioned with reference to FIG. 2 and in other context of the present discourse are generally transistor-based switches but illustrated as electro-mechanical switches in the Figs. to simplify explanation.

Figure 3A:
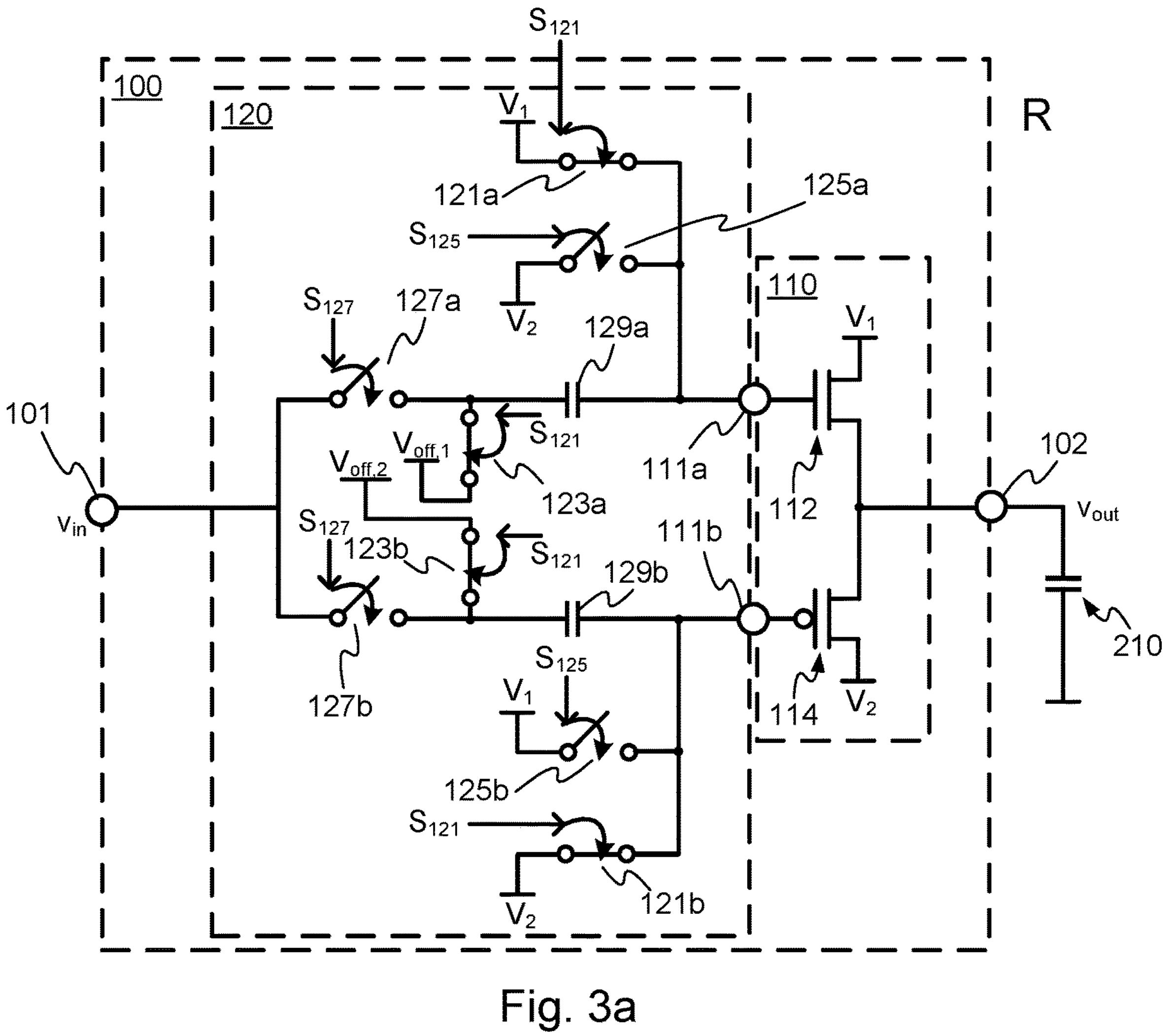
FIG. 3*a* is a schematic view of a three-state buffer circuit according to some embodiments.
Figure 3B:
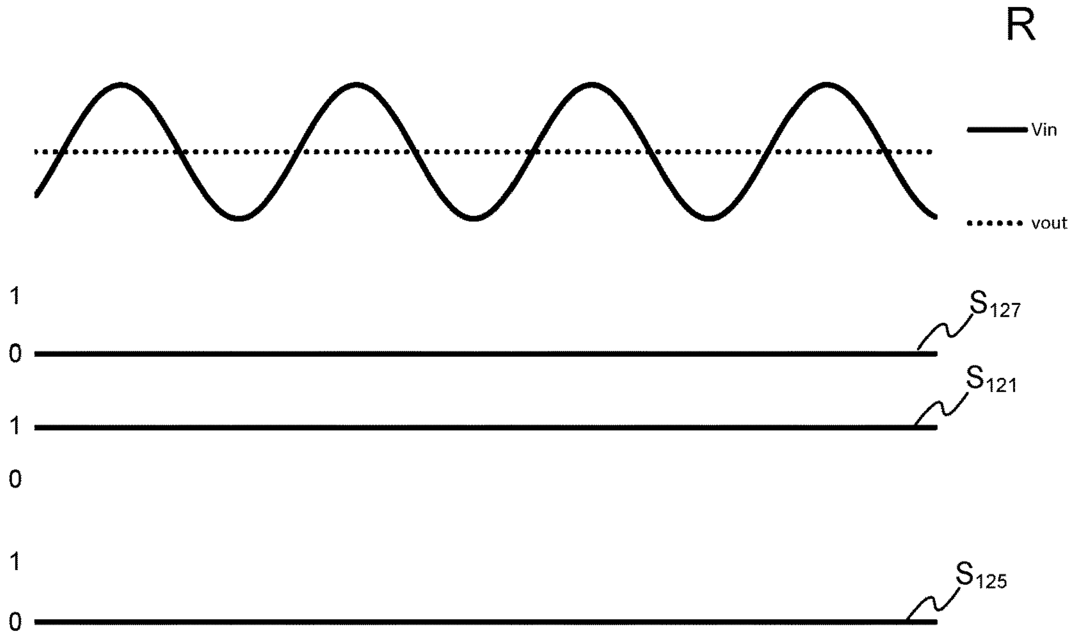
FIG. 3*b* is a signal graph associated with the three-state buffer circuit of FIG. 3*a;*

With reference to FIGS. 3*a* and 3*b*, the reset state R of the three-state buffer circuit 100 according to some embodiments of the present disclosure will be explained. The explanation will be based in the circuitry of FIG. 2, but as the skilled person will appreciate after digesting the teachings herein, that this is but one example and the circuitry may be configured in various different ways and still provide the corresponding functionality. In FIG. 3*a*, the corresponding circuit as illustrated in FIG. 2 is shown, but with the control signals $S_{121}$, $S_{125}$, $S_{127}$ configured to control the three-state buffer circuit 100 to operate at the reset state R. This is illustrated in FIG. 3*b*, wherein, assuming all control signals $S_{121}$, $S_{125}$, $S_{127}$ are active high, the reset control signal $S_{121}$ is high, the hold control signal $S_{125}$ is low and the tracking control signal $S_{127}$ is low. FIG. 3*b* further illustrates the input voltage $v_{in}$ (top-most solid line in FIG. 3*b*) and the output voltage $v_{out}$ (dotted line in FIG. 3*b*) overlaid. All signals in FIG. 3*b* are shown at a common horizontal time-axis. This is reflected in FIG. 3*a* wherein the switches controlled by the reset control signal $S_{121}$ are closed (conducting) and the remaining switches are open (not conducting)

Specifically in FIG. 3*a*, the first high side reset switch 121*a*, the first low side reset switch 121*b*, the second high side reset switch 123*a* and the second low side reset switch 123*b* are all closed. At the reset state R, the input terminal 101 is disconnected from the voltage follower 110 and the positive voltage rail $V_1$ is connected to the gate 111*a* of the first source follower 112 and the negative voltage rail $V_2$ is connected to the gate 111*b* of the second source follower 114. This means that the output voltage $v_{out}$ is determined by a gate-source voltages $V_{gs,112}$ of the first source followers 112 and the positive voltage rail $V_1$ together with a gate-source voltages $V_{gs,114}$ of the second source followers 114 and the negative voltage rail $V_2$ such that $v_{out}=V_1-V_{gs,112}=V_2+V_{gs,114}$. This voltage, $V_1-V_{gs,112}=V_2+v_{gs,114}$, is referred to as a reset voltage $V_{res}$. Assuming that the first source follower 112 and the second source follower 114 are matched with regards to their respective gate-source voltages $v_{gs,112}$, $v_{gs,114}$ the reset voltage $V_{res}$ may be described as $V_{res}=V_2+(V_1-V_2)/2=(V_1+V_2)/2$. The output voltage $v_{out}$ illustrated in FIG. 3*b* is at the reset voltage $V_{res}$ and is actively driven at this level by the voltage follower 110.

In addition to the above, at the reset state R, the DC shift arrangement 129 is charged. Across the first DC shift device 129*a*, a first DC shift voltage $V_{DC,1}$ is provided. The first DC shift voltage $V_{DC,1}$ is defined with a positive node towards the gate 111*a* of the first source follower such that $V_{DC,1}=V_1-V_{os,1}$. Correspondingly, across the second DC shift device 129*b*, a second DC shift voltage $V_{DC,2}$ is provided. The second DC shift voltage $V_{DC,2}$ is defined with a positive node towards the gate 111*b* of the second source follower 114 such that $V_{DC,2}=V_2-V_{os,2}$.

Figure 4A:
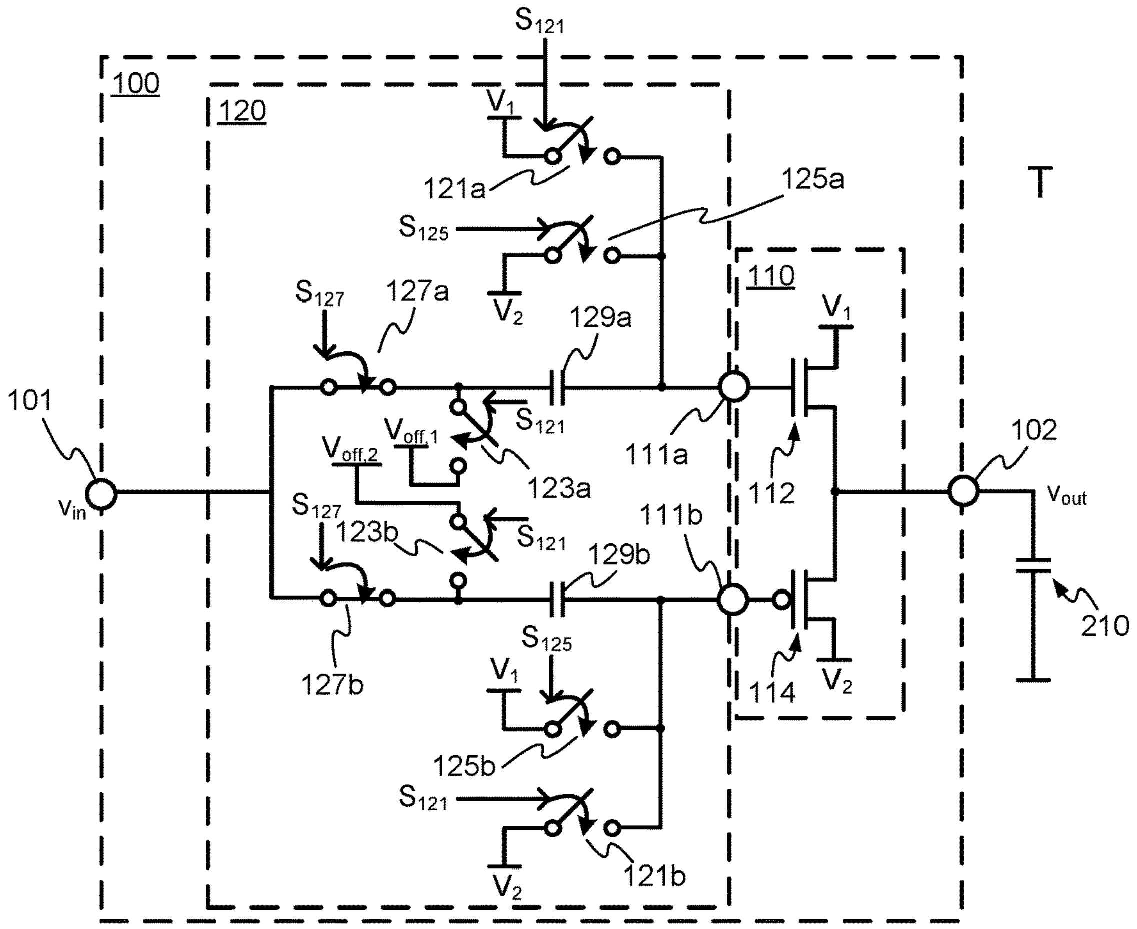
FIG. 4*a* is a schematic view of a three-state buffer circuit according to some embodiments.
Figure 4B:
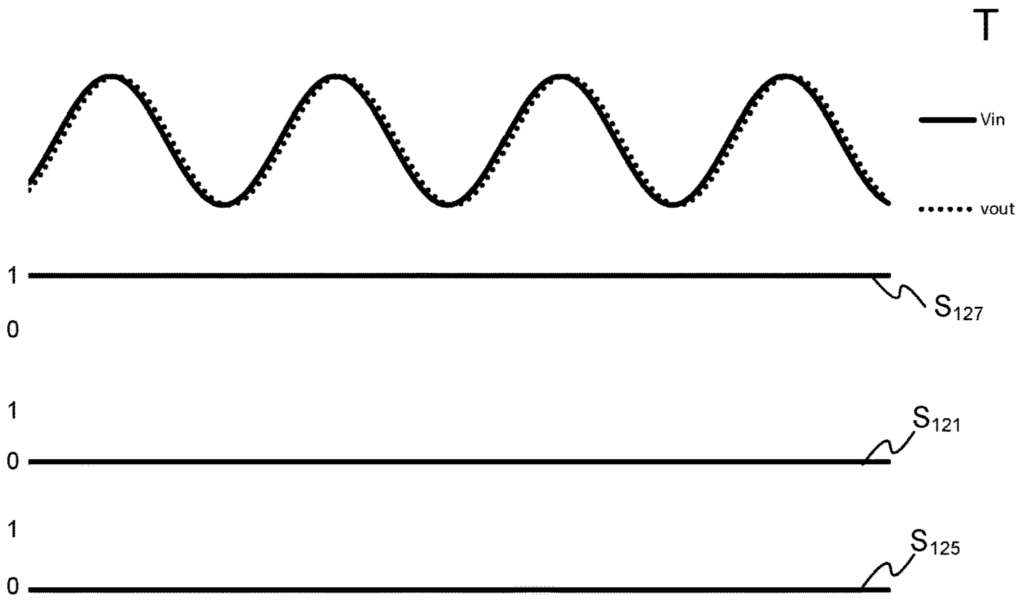
FIG. 4*b* is a signal graph associated with the three-state buffer circuit of FIG. 4*a;*

With reference to FIGS. 4*a* and 4*b*, the tracking state T of the three-state buffer circuit 100 according to some embodiments of the present disclosure will be explained. The explanation will be based in the circuitry of FIG. 2, but as the skilled person will appreciate after digesting the teachings herein, that this is but one example and the circuitry may be configured in various different ways and still provide the corresponding functionality. In FIG. 4*a*, the corresponding circuit as illustrated in FIG. 2 is shown, but with the control signals $S_{121}$, $S_{125}$, $S_{127}$ configured to control the three-state buffer circuit 100 to operate at the tracking state T. This is illustrated in FIG. 4*b*, wherein, assuming all control signals $S_{121}$, $S_{125}$, $S_{127}$ are active high, the reset control signal $S_{121}$ is low, the hold control signal $S_{125}$ is low and the tracking control signal $S_{127}$ is high. FIG. 4*b* further illustrates the input voltage $v_{in}$ (top-most solid line in FIG. 4*b*) and the output voltage $v_{out}$ (dotted line in FIG. 4*b*). All signals in FIG. 4*b* are shown at a common horizontal time-axis. This is reflected in FIG. 4*a* wherein the switches controlled by the tracking control signal $S_{127}$ are closed (conducting) and the remaining switches are open (not conducting).

Specifically in FIG. 4*b*, the high side tracking switch 127*a* is closed connecting the input port 101 of the three-state buffer circuit 100 to the first DC shift device 129*a* and the low side tracking switch 127*b* is closed connecting the input port 101 of the three-state buffer circuit 100 also to the second DC shift device 129*b*. As all other switches are open, the input voltage $v_{in}$ is provided at the gates 111*a*, 111*b* of the source followers 112, 114 via the DC shift devices 129*a*, 129*b*. Consequently, the output voltage $v_{out}$ will track the input voltage $v_{in}$ as shown in FIG. 4*b*. As explained with reference to FIG. 3*a*, the DC shift arrangement 129 was charged during the reset state R which, assuming it was not charged to 0 V, provides a voltage shift across the DC shift devices 129*a*, 129*b*. This is generally beneficial as any DC component of the input voltage $v_{in}$ would have to charge the DC shift arrangement 129 increasing a load of a source and decreasing the settling time of the three-state buffer circuit 100. However, by controlling the offset voltages $V_{os,1}$, $V_{os,2}$, it is possible to ensure that the DC shift voltages $V_{DC,1}$, $V_{DC,2}$ correspond to any DC component at the input terminal 101 of the three-state buffer circuit 100.

It should be mentioned that although the input voltage $v_{in}$ is provided through the high side tracking switch 127*a* and the low side tracking switch 127*b*, one further benefit of the present disclosure is that the linearity performance of these switches 127*a*, 127*b* is non-critical. Or rather, it is good enough even without bootstrapping. This is related to the impedance they drive, the gates 111*a*, 111*b* of the source followers 112, 114, which is comparably high, i.e. a gate capacitance $C_{gg}$ is small. This reduces a signal current flowing into the switches 127*a*, 127*b* and consequently a voltage modulation of on-resistance of the switches 127*a*, 127*b*.

Generally, in order to provide tracking of the input voltage $v_{in}$ without introducing significant loss to the input voltage $v_{in}$, a capacitance of the first DC-shift device 129*a* and the second DC-shift device 129*b* is preferably larger than the gate capacitance $C_{gg}$ of the gates 111*a*, 111*b* of the source followers 112, 114. By providing such configuration, a source providing the input voltage $v_{in}$ will be loaded via an equivalent capacitance which may, as the capacitance of the DC-shift devices 129*a*, 129*b* is (much) larger than the gate capacitances $C_{gg}$ of the source followers 112, 114, be approximated by a sum of the gate capacitances $C_{gg}$ of the source followers 112, 114. In addition to this, in order to increase a settling time at the gates 111*a*, 111*b* of the source followers 112, 114, the sizes of the source followers 112, 114 (i.e. transistor sizes) may be selected in such a way that bandwidth and/or linearity requirements of the three-state buffer circuit 100 are not limited by a time constant determined by a resistance of the source providing the input voltage $v_{in}$, the on-resistance of the switches 127*a*, 127*b* and the gate capacitances $C_{gg}$ of the source followers 112, 114.

This design strategy is likely to result in a further reduced size of the source follower. A reduced size will further increase low noise performance and increase an ability to drive large sampling capacitors 210. A plurality of three-state buffer circuits 100 may be connected in parallel resulting in maintained bandwidth and linearity as the time constants of each of the three-state buffer circuits 100 are preserved. This is assuming that the resistance of the source providing the input voltage $v_{in}$ is also parallelized (or tethered).

Figure 5A:
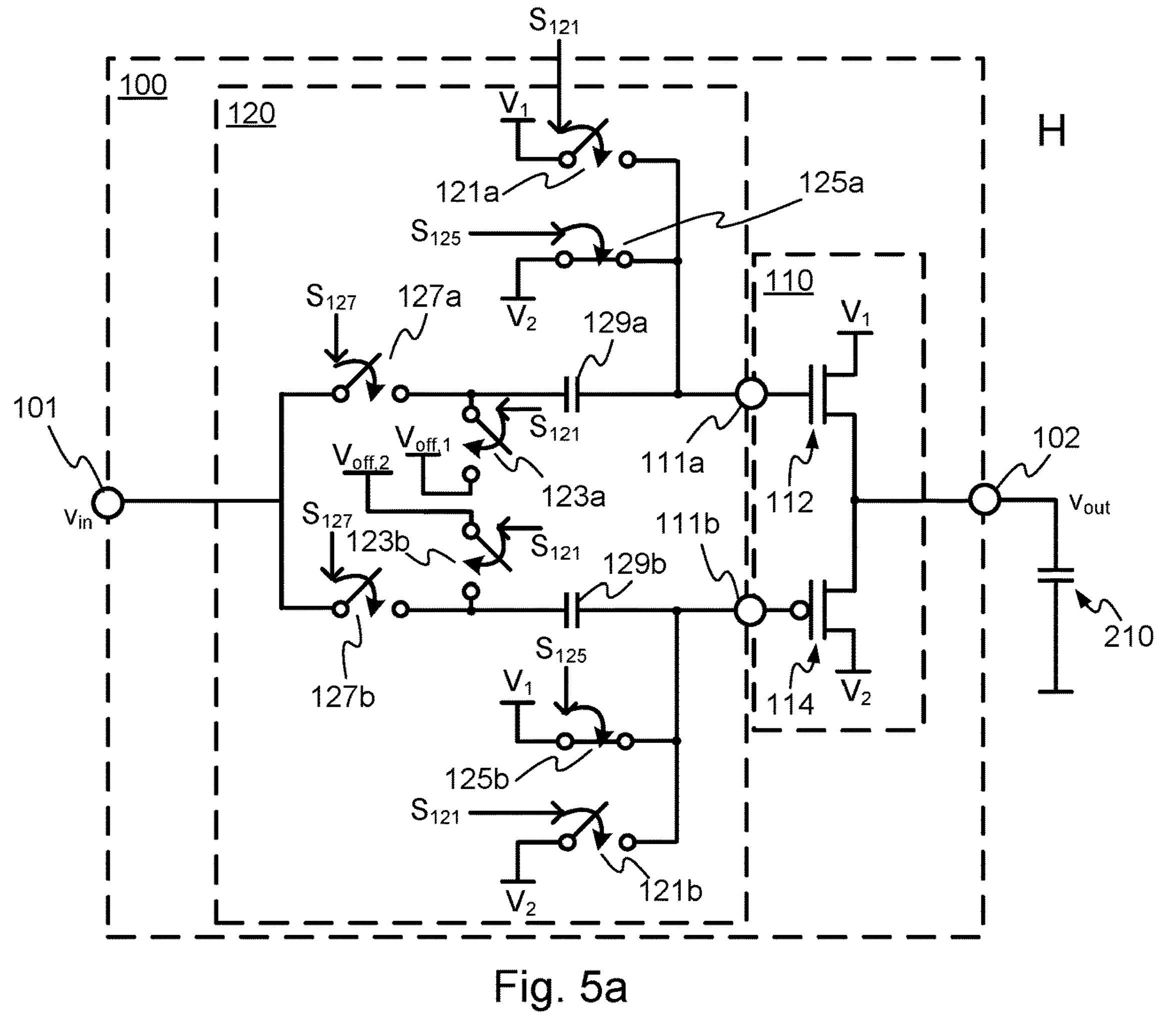
FIG. 5*a* is a schematic view of a three-state buffer circuit according to some embodiments.
Figure 5B:
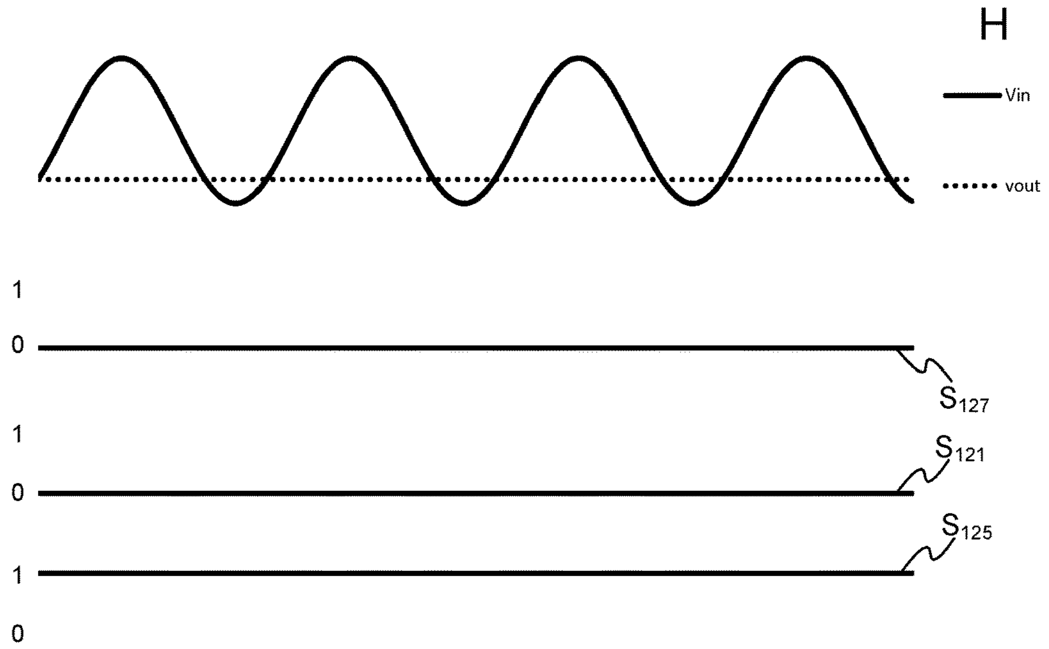
FIG. 5*b* is a signal graph associated with the three-state buffer circuit of FIG. 5*a;*

With reference to FIGS. 5*a* and 5*b*, the hold state H of the three-state buffer circuit 100 according to some embodiments of the present disclosure will be explained. The explanation will be based in the circuitry of FIG. 2, but as the skilled person will appreciate after digesting the teachings herein, that this is but one example and the circuitry may be configured in various different ways and still provide the corresponding functionality. In FIG. 5*a*, the corresponding circuit as illustrated in FIG. 2 is shown, but with the control signals $S_{121}$, $S_{125}$, $S_{127}$ configured to control the three-state buffer circuit 100 to operate at the hold state H. This is illustrated in FIG. 5*b*, wherein, assuming all control signals $S_{121}$, $S_{125}$, $S_{127}$ are active high, the reset control signal $S_{121}$ is low, the hold control signal $S_{125}$ is high and the tracking control signal $S_{127}$ is low. FIG. 5*b* further illustrates the input voltage $v_{in}$ (top-most solid line in FIG. 5*b*) and the output voltage $v_{out}$ (dotted line in FIG. 5*b*) overlaid. All signals in FIG. 5*b* are shown at a common horizontal time-axis. This is reflected in FIG. 5*a* wherein the switches controlled by the hold control signal $S_{125}$ are closed (conducting) and the remaining switches are open (not conducting).

Specifically in FIG. 5*b*, the high side hold switch 125*a* is closed connecting the gate 111*a* of the first source follower 112 to the negative voltage rail $V_2$. Also the low side hold switch 125*b* is closed connecting the gate 111*b* of the second source follower 114 to the positive voltage rail $V_1$. As a result, both source followers 112, 114 are turned off, effectively leaving the output terminal 102 of the three-state buffer circuit floating (undefined, high impedance) state. This means that substantially no current will flow through either of the source followers 112, 114 and any load, e.g. the sampling capacitor 210, will be maintained at the voltage level provided at the output terminal 102 of the three-state buffer circuit prior to entering the hold state H, this is assuming that no external devices are discharging the load. This is visualized in FIG. 5*b* wherein the output voltage $v_{out}$ is constant at a level that was provided at the output terminal 102 when the hold state H was entered, assumed to be at the leftmost data point of the graph in FIG. 5*b*.

Figure 6:
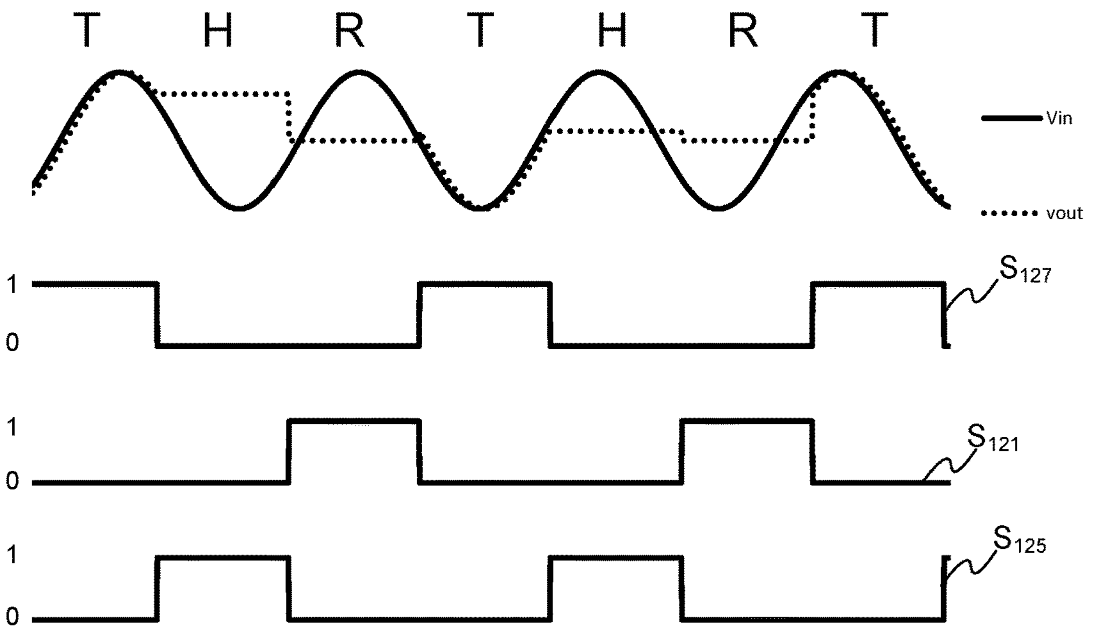
FIG. 6 is a signal graph according to some embodiments.

In FIG. 6, the corresponding graphs of FIGS. 3*b*, 4*b* and 5*b* are shown but in the same graph, illustrating the output voltage $v_{out}$ provided by the three-state buffer 100 at the different operating states T, H, R. In FIG. 6, the three-state buffer 100 is operating at each of the three states T, H, R wherein each operation is roughly indicated at the top of the graph. At the left most portion of the graph in FIG. 6, the three-state buffer 100 is operating at the tracking state T. At this state, the output voltage $v_{out}$ tracks the input voltage $v_{in}$ (with a slight phase shift for illustrative purposes). As previously presented, the tracking state T is controlled by (assuming active high control) placing the reset control signal $S_{121}$ at a low state, the hold control signal $S_{125}$ at a low state and the tracking control signal $S_{127}$ at a high state. Following the tracking state T in FIG. 6 is the hold state H which is entered by changing the tracking control signal $S_{127}$ to a low state and the hold control signal $S_{125}$ to a high state. At the hold state H, the output voltage $v_{out}$ is kept at the level it was at when the hold control signal $S_{125}$ was shifted to a high state. Following the hold state H in FIG. 6 is the reset state R which is entered by changing the hold control signal $S_{125}$ to a low state and the reset control signal $S_{121}$ to a high state. At the reset state R, the output voltage $v_{out}$ is driven to the reset voltage $V_{res}$ which in FIG. 6 is substantially the same as any DC-offset of the input voltage $v_{in}$.

Figure 7A:
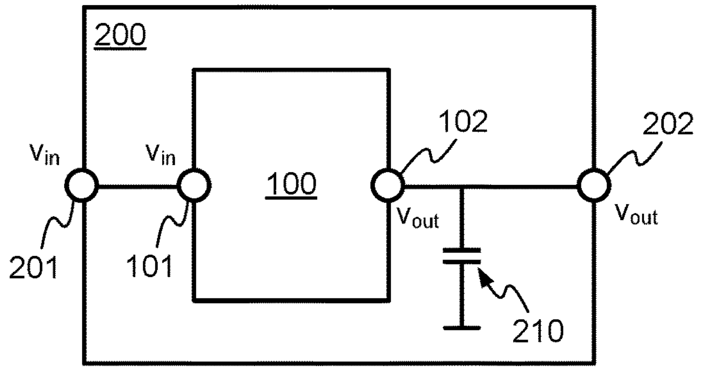
FIGS. 7*a-b* are schematic views of track and hold circuits according to some embodiments.

With reference to FIG. 7*a*, a resettable track and hold circuit 200 according to some embodiments of the present disclosure will be presented. The resettable track and hold circuit 200 comprises the three-state buffer circuit 100 according to any of the embodiments or examples presented herein. The output terminal 102 of the three-state buffer circuit 100 is operatively connected to an output terminal 202 of the resettable track and hold circuit 200. Correspondingly, the input terminal 101 of the three-state buffer circuit 100 is operatively connected to an input terminal 201 of the resettable track and hold circuit 200. The resettable track and hold circuit 200 further comprises the sampling capacitor 210 connected in parallel between the output terminal 102 of the three-state buffer circuit 100 and the output terminal 202 of the resettable track and hold circuit 200. In other words, the sampling capacitor 210 is arranged such that the output voltage $v_{out}$ provided at the output terminal 102 of the three-state buffer circuit 100 is across the sampling capacitor 210.

Figure 7B:
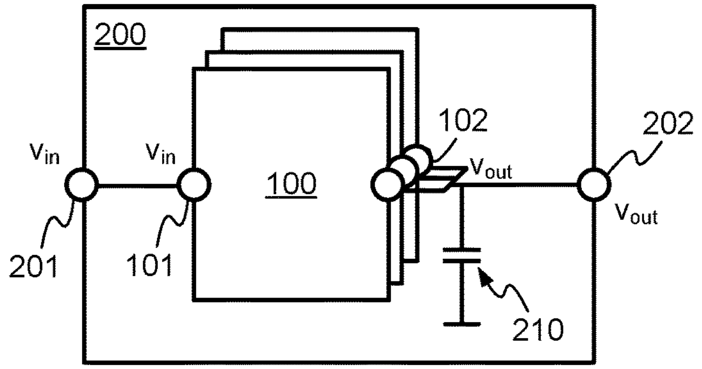

In FIG. 7*b*, a corresponding resettable track and hold circuit 200 as the one illustrated in FIG. 7*a* is shown with one difference. The resettable track and hold circuit 200 in FIG. 7*b* comprises more than one three-state buffer circuit 100 according to any of the embodiments or examples presented herein. In FIG. 7*b*, the track and hold circuit 200 is illustrated as comprising three three-state buffer circuits 100, but the skilled person will appreciate that any number of three-state buffer circuit 100 may be comprised in the resettable track and hold circuit 200. Having more than one three-state buffer circuit 100 in the resettable track and hold circuit 200 may be beneficial as the drive strength of the resettable track and hold circuit 200 may be increased. I.e. the sampling capacitor 120 may have an increased capacitance. This is made possible by the three-state buffer circuit 100 of the present disclosure as no bandwidth or linearity limitation will be introduced by parallelizing the three-state buffer circuit 100.

Figure 8A:
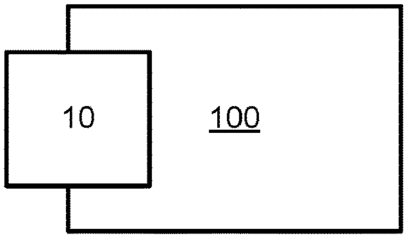
FIGS. 8*a-b* are schematic views of controllers according to some embodiments.
Figure 8B:
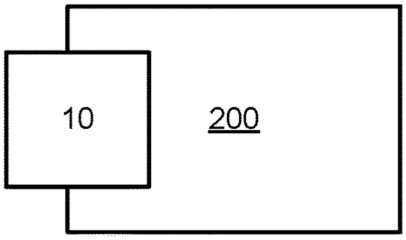

In FIG. 6, the time at which the three-state buffer circuit 100 operates in each state T, H, R is substantially equal, i.e. each state T, H, R has a duty cycle of ⅓. However, in some embodiments, the states T, H, R may have different duty cycles. With reference to FIG. 8*a*, one benefit of the three-state buffer circuit 100 is that an associated controller 10 controlling the control signals $S_{121}$, $S_{125}$, $S_{127}$ may be configured to customize the duration of each state T, H, R. This allows for matching of transfer functions between three-state buffer circuits 100 when e.g. more than one three-state buffer circuit 100 is utilized. Preferably, control signals $S_{121}$, $S_{125}$, $S_{127}$ are provided non-overlapping, i.e. only one active at a time, to ensure that no short circuits or unwanted charging/discharging of the sampling capacitor 210 occurs. In some embodiments, a guard interval may be introduced between one or more of the states T, H, R. The guard interval may be defined as a, compared to the active time, short time period at which none of the control signals $S_{121}$, $S_{125}$, $S_{127}$ are active. In embodiments where a guard interval is utilized, the duty cycle of one or more of the states T, H, R is reduced from the exemplified duty cycle of ⅓. Preferably, the duty cycles of each of the states T, H, R are the same. In some embodiments wherein a guard interval is utilized, the duty cycle of each state T, H, R is ¼. The controller 10 may, as illustrated in FIG. 8*a*, be comprised in or operatively connected to the three-state buffer circuit 100 according to any of the embodiments or examples presented herein. In FIG. 8*b*, an alternative configuration of the controller 10 is shown wherein it is comprised in, or operatively connected to, the resettable track and hold circuit 200 according to any of the embodiments or examples presented herein.

Figure 9A:
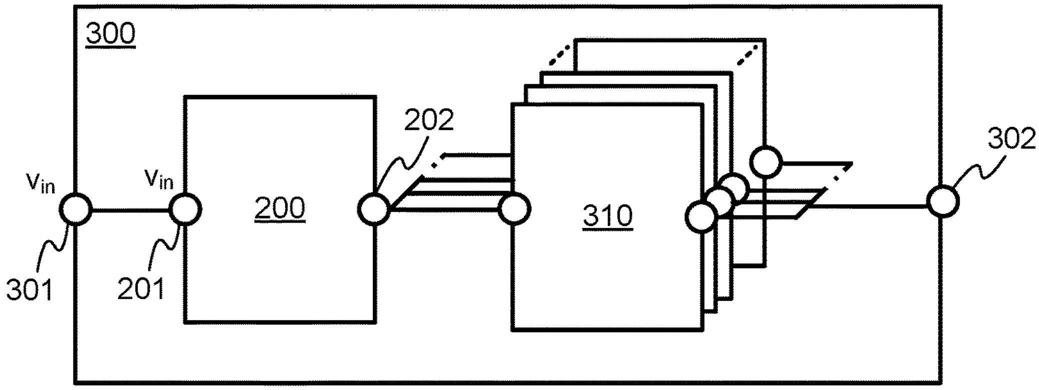
FIGS. 9*a-c* are schematic views of analog to digital converters according to some embodiments.
Figure 9B:
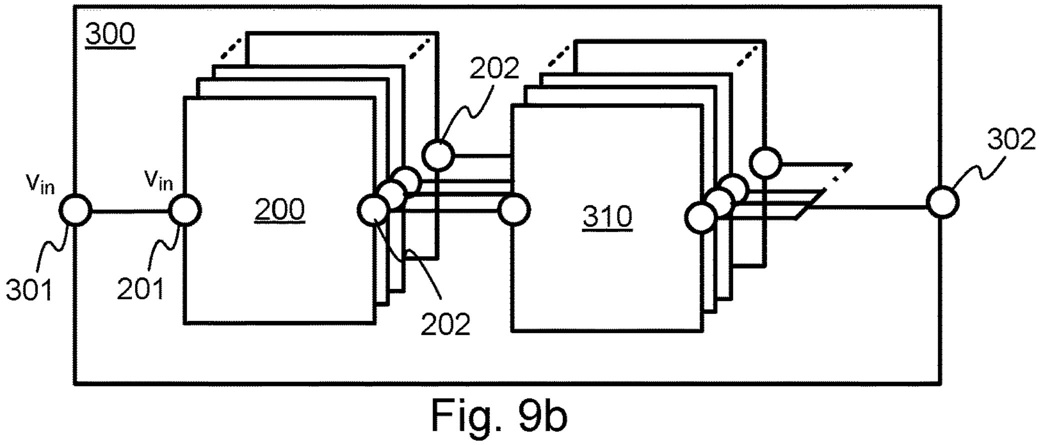
Figure 9C:
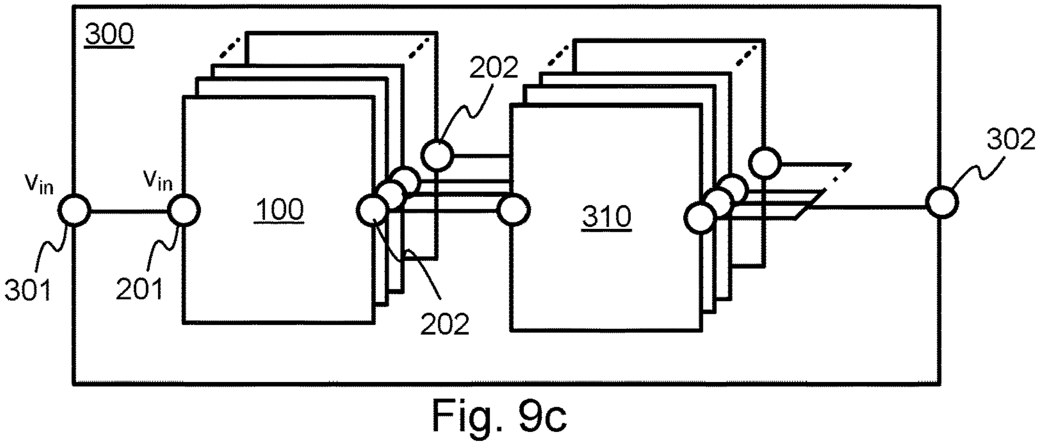

In FIG. 9*a*, an analog to digital converter (ADC) 300 is shown. The ADC 300 comprises the resettable track and hold circuits 200 according to any of the embodiments or examples presented herein. As is known by the skilled person, a general ADC may be provided in a number of different architectures such as Direct-conversion ADCs, Successive approximation ADCs, Ramp-compare ADCs, Wilkinson ADCs, Integrating ADCs, Delta-encoded ADCs, Pipelined ADCs, Sigma-delta ADCs, Time-interleaved ADCs, Intermediate FM stage ADCs, Time-stretch ADCs etc. Depending on the architecture chosen, a connection between the resettable track and hold circuits 200 and an ADC unit block 310. As illustrated in FIG. 9*a*, the ADC 300 comprises one resettable track and hold circuits 200 connected to a plurality of ADC unit blocks 310. Correspondingly, In FIG. 9*b*, the ADC 300 is illustrated comprising a plurality of resettable track and hold circuits 200 connected in parallel, each connected to one ADC unit block 310. The intention is to illustrate the versatility of the resettable track and hold circuits 200 comprising the three-state buffer circuit 100 according to any of the embodiments or examples presented herein. In particular, in FIG. 9*c*, the ADC 300 is not required to comprise the full resettable track and hold circuits 200 but may be configured with three-state buffer circuits 100 in place of the resettable track and hold circuits 200, i.e. the sampling capacitor is not comprised in the resettable track and hold circuits 200. The latter example illustrated in FIG. 9*c* may be a charge redistribution ADC (C-DAC). Such C-DACs are commonly configured with a plurality of ADC unit blocks 310 each comprising capacitive unit elements. In this embodiment, the capacitive unit elements will function as sampling capacitor 210 as presented herein.

Figure 10:
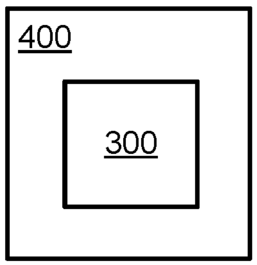
FIG. 10 is a schematic view of an integrated circuit according to some embodiments.

In FIG. 10, an integrated circuit (IC) 400 according to the present disclosure is shown. The IC is illustrated as comprising the ADC 300 according to any of the embodiments or examples presented herein. In some embodiments (not shown), the IC 300 does not comprise the full ADC 300 but rather the resettable track and hold circuits 200 according to any of the embodiments or examples presented herein. In some embodiments (not shown), the IC 300 does not comprise the full resettable track and hold circuits 200 but rather the three-state buffer circuits 100 according to any of the embodiments or examples presented herein.

Figure 11A:
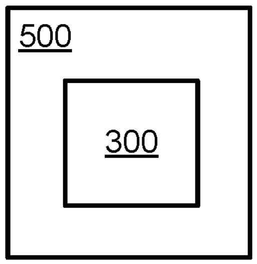
FIGS. 11*a-c* are schematic views of apparatuses according to some embodiments.
Figure 11B:
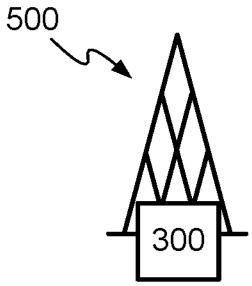
Figure 11C:
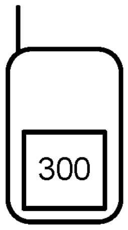

In FIG. 11*a*, an apparatus 500 according to some embodiments of the present disclosure is shown. The apparatus is shown comprising the ADC 300 according to any of the embodiments or examples presented herein. In some embodiments (not shown), the apparatus 500 does not comprise the full ADC 300 but rather the resettable track and hold circuits 200 according to any of the embodiments or examples presented herein. In some embodiments (not shown), apparatus 500 does not comprise the full resettable track and hold circuits 200 but rather the three-state buffer circuits 100 according to any of the embodiments or examples presented herein. In some embodiments, see FIG. 11*b*, the apparatus 500 is a network node 500. In some embodiments, see FIG. 11*c*, the apparatus 500 is a wireless device 500.

Modifications and other variants of the described embodiments will come to mind to one skilled in the art having benefit of the teachings presented in the foregoing description and associated drawings. Therefore, it is to be understood that the embodiments are not limited to the specific example embodiments described in this disclosure and that modifications and other variants are intended to be included within the scope of this disclosure. For example, while embodiments of the invention have been described with reference to analog to digital conversion, persons skilled in the art will appreciate that the embodiments of the invention can equivalently be applied to any other application wherein high linearity, low footprint and high bandwidth sampling circuitry are required. Furthermore, although specific terms may be employed herein, they are used in a generic and descriptive sense only and not for purposes of limitation. Therefore, a person skilled in the art would recognize numerous variations to the described embodiments that would still fall within the scope of the appended claims. Furthermore, although individual features may be included in different claims (or embodiments), these may possibly advantageously be combined, and the inclusion of different claims (or embodiments) does not imply that a combination of features is not feasible and/or advantageous. In addition, singular references do not exclude a plurality. Finally, reference signs in the claims are provided merely as a clarifying example and should not be construed as limiting the scope of the claims in any way.

The invention claimed is:

1. A three-state buffer circuit comprising a voltage follower for directly driving a sampling capacitor at an output terminal of the three-state buffer circuit, and a switched capacitor circuit connected at an input of the voltage follower and configured to control the voltage follower to operate in one of:

a tracking state, at which the voltage follower is configured to provide an output voltage at the output terminal at a level corresponding to an input voltage at an input terminal of the three-state buffer circuit;

a hold state, at which the voltage follower is configured not to provide any output voltage at the output terminal; and a reset state at which the voltage follower is configured to provide an output voltage at the output terminal at a reset voltage.

2. The three-state buffer circuit of claim 1, wherein the voltage follower is a source follower arrangement comprising a first source follower and a second source follower operating as a complementary source follower;

the switched capacitor circuit further comprises a first DC shift device arranged between the first source follower and the input terminal of the three-state buffer circuit, and a second DC shift device arranged between the second source follower and the input terminal of the three-state buffer circuit; and the output terminal of the three-state buffer circuit is provided at the source terminals of the first source follower and the second source follower.

3. The three-state buffer circuit of claims 2, wherein the first switch arrangement comprises a first high side reset switch controlled by the reset control signal and thereby operable to connect a gate of the first source follower to a first voltage, and a first low side reset switch controlled by the reset control signal and thereby operable to connect a gate of the second source follower to a second voltage.

4. The three-state buffer circuit of claim 2, wherein the switched capacitor circuit further comprises a tracking switch arrangement controlled by a tracking control signal and operable to control a connection between the input terminal of the three-state buffer circuit and the input of the voltage follower.

5. The three-state buffer circuit of claim 4, wherein the tracking switch arrangement comprises a high side tracking switch controlled by the tracking control signal and operable to connect the first DC shift device to the input terminal of the three-state buffer circuit, and a low side tracking switch controlled by the tracking control signal and operable to connect the second DC shift device to the input terminal of the three-state buffer circuit.

6. The three-state buffer circuit of claim 4, configured to operate in the tracking state responsive to a state of a tracking control signal.

7. The three-state buffer circuit of claim 2, wherein the first source follower is an NMOS source follower and the second source follower is a PMOS source follower.

8. The three-state buffer circuit claim 2, wherein at least one of the first DC shift device and the second DC shift device is a capacitor.

9. The three-state buffer circuit of claim 1, wherein the switched capacitor circuit comprises a first switch arrangement configured to be controlled by a reset control signal and thereby operable to bias the input of the voltage follower to an active state.

10. The three-state buffer circuit of claim 9, wherein the voltage follower is a source follower arrangement comprising a first source follower and a second source follower operating as a complementary source follower;

the switched capacitor circuit further comprises a first DC shift device arranged between the first source follower and the input terminal of the three-state buffer circuit, and a second DC shift device arranged between the second source follower and the input terminal of the three-state buffer circuit;

the output terminal of the three-state buffer circuit is provided at the source terminals of the first source follower and the second source follower; and three-state buffer circuit further comprising a second switch arrangement configured to be controlled by the reset control signal, wherein the second switch arrangement comprises a second high side reset switch operable to connect a first offset voltage between the first DC-shift device and the input terminal of the three-state buffer circuit and a second low side reset switch operable to connect a second offset voltage between the second DC-shift device and the input terminal of the three-state buffer circuit.

11. The three-state buffer circuit of claim 10, wherein the first offset voltage and the second offset voltage are equal.

12. The three-state buffer circuit of claim 9, configured to operate in the reset state responsive to a state of the reset control signal.

13. The three-state buffer circuit of claim 9, wherein the switched capacitor circuit comprises the first switch arrangement, and the first switch arrangement is configured to be controlled by a hold control signal and thereby operable to connect the input of the voltage follower to a hold voltage configured to disable the voltage follower.

14. The three-state buffer circuit of claim 13, wherein the first switch arrangement comprises a high side hold switch controlled by the hold control signal and thereby operable to connect the gate of the first source follower to the second voltage, and a low side hold switch controlled by the hold control signal and operable to connect the gate of the second source follower to the first voltage.

15. The three-state buffer circuit of claim 13, configured to operate in the hold state responsive to a state of the hold control signal.

16. A resettable track and hold circuit, comprising:

a three-state buffer circuit, the three state buffer circuit comprising a voltage follower for directly driving a sampling capacitor at an output terminal of the three-state buffer circuit, and a switched capacitor circuit connected at an input of the voltage follower and configured to control the voltage follower to operate in one of:

a tracking state, at which the voltage follower is configured to provide an output voltage at the output terminal at a level corresponding to an input voltage at an input terminal of the three-state buffer circuit;

a hold state, at which the voltage follower is configured not to provide any output voltage at the output terminal; and a reset state at which the voltage follower is configured to provide an output voltage at the output terminal at a reset voltage; and a sampling capacitor connected in parallel between the output terminal of the three-state buffer circuit and an output terminal of the resettable track and hold circuit thereby providing the output voltage of the three-state buffer circuit across the sampling capacitor.

17. The resettable track and hold circuit of claim 16, wherein the resettable track and hold circuit is comprised in an analog to digital converter, ADC.

18. An apparatus, comprising an analog to digital converter, ADC, the ADC comprising a resettable track and hold circuit, the resettable track and hold circuit comprising:

a three-state buffer circuit, the three state buffer circuit comprising a voltage follower for directly driving a sampling capacitor at an output terminal of the three-state buffer circuit, and a switched capacitor circuit connected at an input of the voltage follower and configured to control the voltage follower to operate in one of:

a tracking state, at which the voltage follower is configured to provide an output voltage at the output terminal at a level corresponding to an input voltage at an input terminal of the three-state buffer circuit;

a hold state, at which the voltage follower is configured not to provide any output voltage at the output terminal; and a reset state at which the voltage follower is configured to provide an output voltage at the output terminal at a reset voltage; and a sampling capacitor connected in parallel between the output terminal of the three-state buffer circuit and an output terminal of the resettable track and hold circuit thereby providing the output voltage of the three-state buffer circuit across the sampling capacitor.

19. The apparatus of claim 18, wherein the apparatus is a network node.

20. The apparatus of claim 18, wherein the apparatus is a wireless device.

* * * * *